United States Patent
Brooks et al.

(10) Patent No.: US 6,596,566 B2
(45) Date of Patent: Jul. 22, 2003

(54) CONFORMAL-COATED PICK AND PLACE COMPATIBLE DEVICES

(76) Inventors: Mark Brooks, 127 Hubbell, Mankato, MN (US) 56001; Gary Seibel, 2470 N. Ridge Dr., North Mankato, MN (US) 56003

( * ) Notice: Subject to any disclaimer, the term of this patent is extended or adjusted under 35 U.S.C. 154(b) by 0 days.

(21) Appl. No.: 09/977,735

(22) Filed: Oct. 12, 2001

(65) Prior Publication Data

US 2003/0071395 A1 Apr. 17, 2003

(51) Int. Cl.⁷ .............................................. H01L 21/44
(52) U.S. Cl. ...................... 438/125; 438/126; 438/127; 438/106; 257/787; 257/790
(58) Field of Search ................................. 438/125, 126, 438/127, 106; 257/787, 790

(56) References Cited

U.S. PATENT DOCUMENTS 6,455,864 B1 * 9/2002 Featherby et al. ....... 250/515.1

* cited by examiner

Primary Examiner—David L. Talbott
Assistant Examiner—Luan Thai
(74) Attorney, Agent, or Firm—D L Tschida

(57) ABSTRACT

Conformal-coated devices packaged to be compatible with automated handling equipment. In one arrangement, open-sided, injection-molded shells are mounted around conformal-coated devices to provide dimensionally stable packaging that is compatible with device carriers and automated packaging tool heads that are indexed to select and place the devices. In another arrangement, the coating is heated and additional material is added and re-flowed to define unique surface regions compatible with automated handling equipment.

7 Claims, 2 Drawing Sheets

CONFORMAL-COATED PICK AND PLACE COMPATIBLE DEVICES

BACKGROUND OF THE INVENTION

The present invention relates to conformal-coated circuit packages and, in particular, to a method for forming and retrofitting a package to be compatible with pick and place handling equipment.

Varieties of discrete circuit devices are constructed with conformal coatings that physically and electrically protect the device from environmental conditions. That is, the coatings electrically insulate and protect the circuitry from moisture and physical damage. Separate conformal coatings may also be applied to higher-level circuit board assemblies containing the discrete parts.

A variety of conventional epoxy-based coating materials are known. The coatings can be applied using a variety of conventional techniques, for example, brush, roller, dip, spray, slit-die, among others. The coatings are cured using a variety of techniques, for example, ultraviolet curing (UV) or room temperature vulcanizing (RTV), among others compatible with the particular material, to provide a protective encapsulate.

Conformal coating processes, however, do not provide sufficient dimensional stability to accommodate conventional circuit handling equipment and circuit populating techniques. That is, surface imperfections and dimensional variations require hand mounting such devices.

In contrast, most integrated circuits are sealed in molded packages. The packaging is injection molded to relatively exact dimensions and tolerances. The result is that any contained electrical device can be adapted to conventional pick-and-place handling equipment. Such equipment is programmed to grip individual packages with suction or finger-type tool heads.

The subject invention was developed to provide alternative methods to make conformal-coated circuit devices that are compatible with standard circuit packaging equipment. One method provides conformal-coated devices that are mounted in injection-molded shells. Another method provides conformal-coated devices that include initially molded or re-formed surface regions that are dimensionally stable and uniquely located to be compatible with pick-and-place equipment.

SUMMARY OF THE INVENTION

It is a primary object of the invention to provide conformal-coated devices that are constructed to be compatible with automated parts handling equipment.

It is a further object of the invention to provide a device having a re-shaped conformal coating that is compatible with automated pick-and-place (PP) handling equipment.

It is a further object of the invention to provide an injection-molded shell adapted to contain a conformal-coated device and to support the device to be compatible with parts carriers and associated automated handling and equipment.

It is a further object of the invention to provide a method for re-flowing and molding a conformal coating material at a device to define a surface region that can be indexed and gripped by automated handling equipment.

It is a further object of the invention to provide thin film, conformal-coated circuit devices having flat surface regions that are adaptable to vacuum tool heads and fingered tool heads.

The foregoing objects, advantages and distinctions are obtained in one form of the invention wherein an open-sided, injection-molded shell is mounted around a conformal-coated device. The shell provides a dimensionally stable container that is compatible with tape carriers and tool heads for packaging equipment that is indexed to select the devices from the tape and place the devices on a circuit board.

Another form of the invention provides a method for re-flowing the conformal coating, adding additional coating material and contacting the heated device with a surface or placing the heated device into a mold to form a uniquely located and re-shaped surface region. The re-shaped surface region is positioned and shaped to be complementary with PP tapes and handling equipment.

Still other objects, advantages and distinctions of the invention will become more apparent from the following description with respect to the appended drawings. To the extent alternative constructions, improvements or modifications have been considered they are described as appropriate. The improvements may also be provided in alternative combinations and arrangements. The description should therefore not be literally construed in limitation of the invention. Rather, the scope of the invention should be broadly interpreted within the scope of the further appended claims.

BRIEF DESCRIPTION OF THE DRAWINGS

Like reference numerals refer to like structure at the various drawings and which are as follows.

DESCRIPTION OF THE PREFERRED EMBODIMENT

Figure 1:
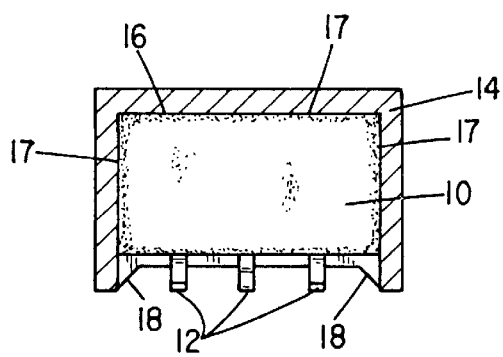
FIG. 1 is a front, cross-section view of a conformal-coated device that is mounted in an injection-molded shell.
Figure 2:
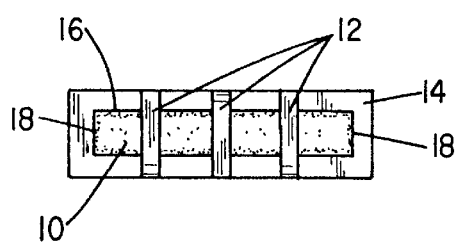
FIG. 2 is a bottom view of the device of FIG. 1.
Figure 3:
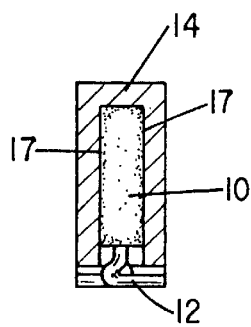
FIG. 3 is a cross-section view through the device of FIG. 1.

Referring to FIGS. 1 through 3, views are shown to an exemplary, conformal-coated circuit device 10. The device 10 can be any type of discrete circuit component, although a thin film delay line device is depicted. The device 10 includes a number of formed surface mount lead terminations 12. The types of circuit terminations can vary amongst a number of conventional types depending upon the populating requirements of each printed circuit assembly.

Although the device 10 exhibits a relatively uniform size, a nominal dimensional tolerance of ±0.500 mm is common. While such a dimensional tolerance is acceptable for manual population of printed circuit boards, the tolerance does not meet industry standards for pick-and-place (PP) packaging equipment.

To overcome this deficiency, a shell 14 of suitable shape can be molded to mount over and contain the device 10. A cavity 16 of the shell 14 is sized to accept and center the device 10 such that the leads 12 are located at a preferred position. Tapered and/or contoured interior surfaces 17 to center the device 10. The shell 14 is constructed to uniform tolerances to overcome deficiencies in the conformal coating at the device 10. The external shape of the shell 14 is also constructed to be compatible with a parts tape or carrier (not shown) that contains the assembled component and from which the PP equipment extracts each shell 14.

The leads 12 are particularly located to assure that subsequent handling of the shell 14 assures that the device 10 is placed on the circuit board with the leads 12 properly positioned to the conductors. The interior walls 17 of the cavity 16 are formed to guide the device 10 into a proper location in the cavity 16. The walls 17 are tapered and/or contoured to center the device 10 in the cavity 16.

The walls of the shell 14 can also be made to flex and compressively grip the device 10. The sidewalls can include cutout regions or apertures to facilitate device mounting or subsequent handling. One or more flexible tabs 18 are provided along the periphery of the shell 14 to firmly constrain the device 10 in the cavity 16.

Although overcoming dimensional deficiencies in conventional conformal-coated parts, use of a separate shell 14 requires an additional part and manual loading of the device into the shell 14. Costs are thereby increased, but flexibility is obtained in retrofitting inventoried parts to multiple packaging techniques.

Figure 4:
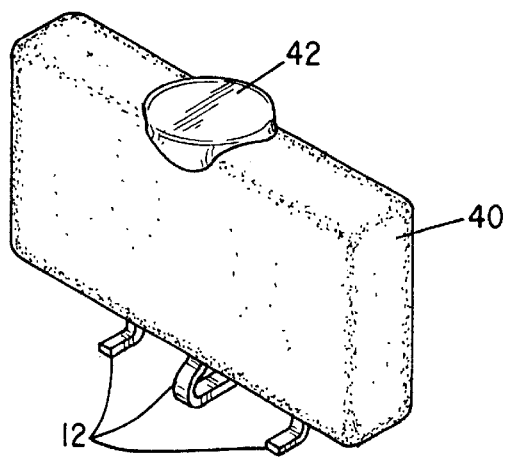
FIG. 4 is a perspective view of a discrete circuit device having a flat, centered circular surface formed a uniquely identified location relative to associated PP handling equipment.
Figure 5:
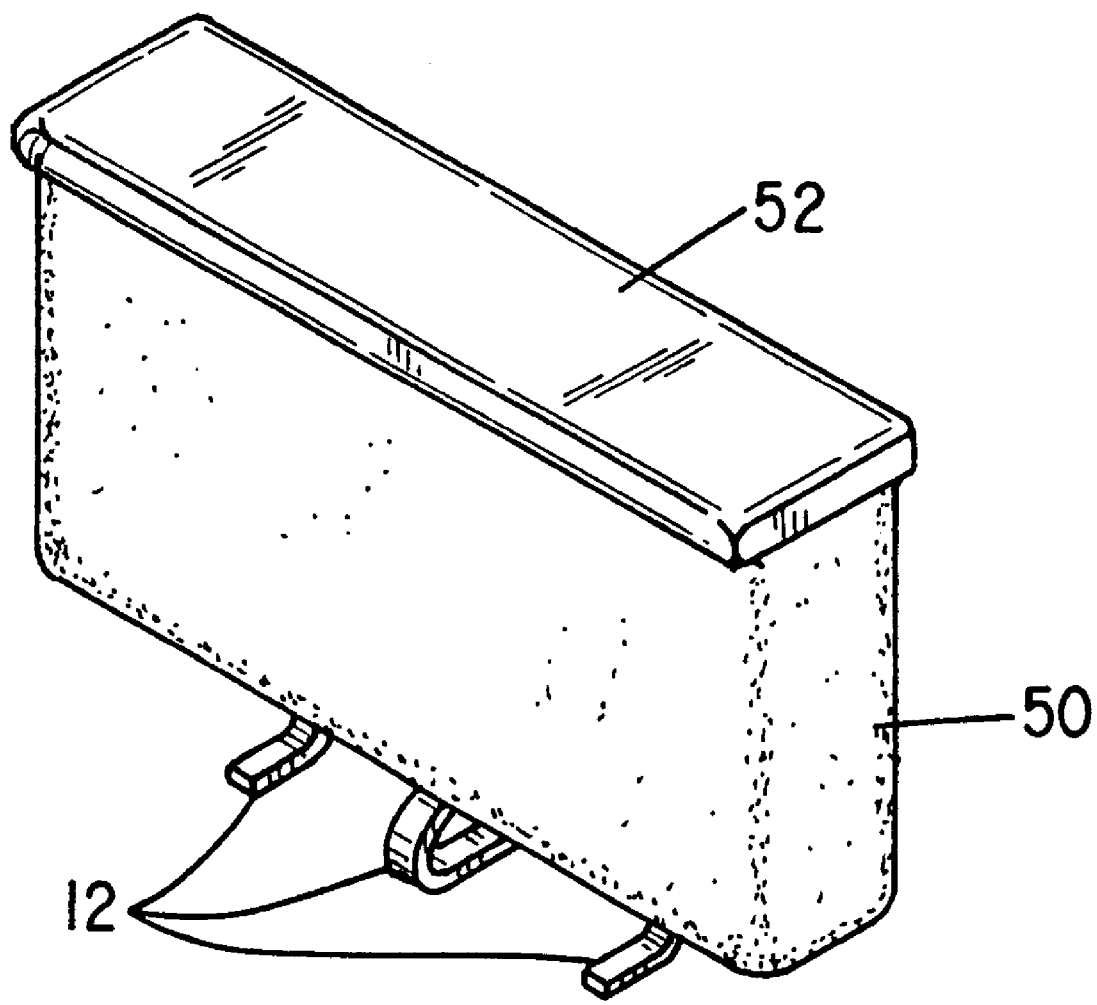
FIG. 5 is a perspective view of a discrete circuit device having a flat longitudinal edge formed at a uniquely identifiable location.

FIGS. 4 and 5 depict devices 40 and 50 constructed using an alternative method for retrofitting and/or manufacturing conformal-coated devices that are adaptable to PP handling equipment. FIGS. 4 and 5 respectively show devices 40 and 50 that provide re-formed, flat surface regions 42 and 52 that are re-shaped to mate with vacuum PP tool heads and/or fingered grippers. The surfaces 42 and 52 are formed after or during manufacture through the re-flow process shown below. The location and shape of the gripping surfaces 42 and 52 can be tailored anywhere on the devices 40 and 50 to facilitates proper handling and higher level circuit packaging.

Generally, however, the devices 40 and 50 are subjected to a suitable temperature that softens the conformal coating material (e.g. silicone resin et al.) and allows the softened material to bond with additional material either added to the device 40 or 50, such as by dipping, or in a mold that defines the gripping surfaces 42 and 52. Upon placing the heated device 40 or 50 onto a suitable surface or into a mold, the softened and additional coating is re-shaped and the surfaces 42 and 52 are uniformly located relative to the leads 12. Dimensional imperfections in the original coating of the device 10 are thereby overcome and the device 10 can be mounted to a suitable PP carrier (e.g. most typically a tape carrier).

Flat Top-Flow Chart and Process Information

1. Preheat conformal-coated device to temperature in range of 175° C. to 240° C.
2. Contact pre-heated device with container containing a controlled amount of conformal epoxy coating at room temperature.
3. Allow pre-heated device to cool to a temperature less than 100° C. while in contact with epoxy, thereby melting a quantity of material onto device, and which material re-solidifies after cooling below 100° C.
4. Re-heat device with quantity of epoxy coating attached to temperature in range of 175° C. to 240° C. for 10 to 50 seconds. Suspend device in vertical position with edge in down position to allow molten material droplet to form at desired location.
5. While molten material droplet is suspended from the product edge bring the droplet and edge into contact with a flat, non-stick surface at room temperature. Material cools Flat Top-Flow Chart and Process Information and solidifies the material to form flat disc on device edge. Alternatively, position device in mold and close.
6. Heat device with shaped conformal coating to 150° C. for approximately 30 minutes to fully cure the coating material.
7. Prepare re-coated device leads to specified length and shape to provide accurate product height when mounted to PP carrier.
8. Verify the electrical performance of device against parameters as specified.

Once mounted to a parts carrier, PP handling equipment is able to precisely and repetitively locate and grip the surfaces 42 and 52 to convey the parts 40 and 50 to a printed circuit board.

Although the foregoing discussion is directed to a retrofitting process, it is to be appreciated devices can be originally manufactured with a shaped conformal coating. In this instance, the device is potted in a mold containing the conformal coating material and which mold has a suitable PP compatible surface.

While the invention has been described with respect to a number of presently preferred delay line devices, the invention can be adapted to any of a variety of discrete circuit components. The geometric configurations of the device packaging can take any desired form. It is also to be appreciated the re-shaping of the conformal coating can be selectively relegated to selected regions of the devices. It is also to be appreciated that still other circuit and device constructions may be suggested to those skilled in the art. The scope of the invention should therefore be construed broadly within the spirit and scope of the following claims.

What is claimed is:

1. A method for retrofitting conformal coated devices, comprising:
   a) exposing a conformal coated device to a temperature sufficient to soften the coating;
   b) depositing an additional quantity of conformal coating material onto the device;
   c) contacting the coated device with a surface to re-shape and define a gripping surface at the device; and
   d) curing the re-shaped device.

2. A method as set forth in claim 1 wherein the heated device is mounted into a mold containing the additional quantity of coating material and wherein said mold has a surface that defines said gripping surface.

3. A method as set forth in claim 1 wherein the heated device is dipped into a quantity of coating material that is prepared to promote cohesion.

4. A method as set forth in claim 1 including mounting the re-shaped device to a carrier containing a plurality of said devices.

5. A method for remanufacturing conformal coated devices, comprising:
   a) exposing a conformal coated device to a temperature sufficient to soften the conformal coating material;
   b) depositing an additional quantity of conformal coating material onto the device;
   c) molding the coated device in a mold having a cavity space that defines a gripping surface;
   d) extracting the device from the mold and curing the molded device; and
   e) mounting the re-molded device to a carrier.

6. A method as set forth in claim 5 including shaping termination leads at the molded device prior to mounting the device to a carrier.

7. A method for remanufacturing conformal coated devices, comprising:
 a) positioning a conformal coated circuit device in a mold containing a quantity of a conformal coating material, wherein the conformal coated circuit device is heated to a temperature sufficient to adhere the heated conformal coating material to the circuit device, and wherein the mold includes a surface that defines a gripping surface at the molded circuit device;
 b) extracting the molded device from the mold and curing the molded device; and
 c) mounting the molded device to a carrier.

* * * * *